(12) United States Patent
Brannmark et al.

(10) Patent No.: US 8,194,885 B2
(45) Date of Patent: Jun. 5, 2012

(54) SPATIALLY ROBUST AUDIO PRECOMPENSATION

(75) Inventors: Lars Johan Brannmark, Uppsala (SE); Mikael Sternad, Uppsala (SE); Anders Ahlen, Knivsta (SE)

(73) Assignee: Dirac Research AB, Uppsala (SE)

( * ) Notice: Subject to any disclaimer, the term of this patent is extended or adjusted under 35 U.S.C. 154(b) by 1112 days.

(21) Appl. No.: 12/052,031

(22) Filed: Mar. 20, 2008

(65) Prior Publication Data

US 2009/0238380 A1 Sep. 24, 2009

(51) Int. Cl.
*H03G 5/00* (2006.01)
(52) U.S. Cl. .......................................................... 381/98
(58) Field of Classification Search .............. 381/56–59, 381/97–103; 700/94
See application file for complete search history.

(56) References Cited

U.S. PATENT DOCUMENTS

| | | | |
|---|---|---|---|
| 4,683,590 A | 7/1987 | Miyoshi et al. | |
| 5,511,129 A | 4/1996 | Craven et al. | |
| 5,627,899 A | 5/1997 | Craven et al. | |
| 5,727,066 A | 3/1998 | Elliott et al. | |
| 6,760,451 B1 * | 7/2004 | Craven et al. | 381/98 |
| 7,215,787 B2 | 5/2007 | Sternad et al. | |

FOREIGN PATENT DOCUMENTS

| | | |
|---|---|---|
| EP | 1 355 509 | 10/2003 |
| EP | 1355509 | * 10/2003 |
| JP | 2007 219479 | 8/2007 |
| JP | 2007 279517 | 10/2007 |

OTHER PUBLICATIONS

Delcroix, M. et al., "Dereverberation and Denoising Using Multichannel Linear Prediction", *IEEE Transactions on Audio, Speech, and Language Processing*, IEEE Service Center, New York, NY., vol. 15, No. 6, Aug. 1, 2007, pp. 1791-1801, XP011187707.

Sternad, M. et al., "Robust decision feedback equalizers", 19930427; 19930427-19930430, vol. 3, Apr. 27, 1993, pp. 555-558, XP010110699.

B. D. Radlovic, R. C. Williamson and R. A. Kennedy, "Equalization in an acoustic reveberant environment: Robustness results," IEEE Transactions on Speech and Audio Processing, vol. 8, No. 3, pp. 311-319, May 2000.

P. Hatzinatoniou and J. Mourjopoluos, "Errors in real-time room acoustics deveberation," J, Audio Engineering Society, vol. 52, No. 9, pp. 883-899, Sep. 2004.

P. Hatzinatoniou and J. Mourjopoluos, "Real-time room equalization based on complex smoothing: Robustness results," Proc. of the 116th AES Convention, 2004.

(Continued)

*Primary Examiner* — Calvin Lee
(74) *Attorney, Agent, or Firm* — Young & Thompson

(57) ABSTRACT

A discrete-time audio precompensation filter is designed based on a linear model that describes the dynamic response of a sound generating system at p>1 listening positions. The filter construction is based on providing information representative of n non-minimum phase zeros $\{Z_i\}$ that are outside of the stability region $|z|=1$ in the complex frequency domain. A causal Finite Impulse Response (FIR) filter, of user-specified degree d, having coefficients corresponding to a causal part of a delayed non-causal impulse response is determined based on the information representative of n non minimum phase zeros. The resulting precompensation filter is determined as the product of at least two scalar dynamic systems, represented by an inverse of a characteristic scalar magnitude response in the frequency domain representing the power gains at the listening positions, and the causal FIR filter designed to approximately invert only non-minimum phase zeros that are safely inverted.

26 Claims, 7 Drawing Sheets

OTHER PUBLICATIONS

R. Wilson, "Equalization of loudspeaker drive units considering both on- and off-axis responses," J. Audio Engineering Society, vol. 39, No. 3, pp. 127-139, 1991.

S. J. Elliott and P. A. Nelson, "Multiple-point equalization in a room using adaptive digital filters," J. Audio Engineering Society, vol. 37, No. 11, pp. 899-907, 1989.

F. Talantzis and D. B. Ward, "Robustness of multichannel equalization in an acoustic reverberation environment," Journal of the Acoustic Society of America, vol. 114, No. 2, pp. 833-841, 2003.

F. Talantzis and L. Polymenakos, "Robustness of non-exact multichannel equalization in reveberant environments," in Artificial Intelligence and Innovations 2007: From Theory to Applications, C. Boukis, A. Pnevmatikakis and L. Polymerankos, eds, vol. 247 of IFIP International Federation for Information Processing, pp. 315-321, Springer, Boston, 2007.

M. Sternad and A. Ahlén, "LQ controller design and self-tuning control," in Polynomial Methods in Optimal Control and Filtering, K. Hunt ed., pp. 56-92, Peter Peregrinus, London, 1993.

Aström K.J. and B. Wittenmark (1997) Computer-Controlled Systems, 3rd ed. Prentice-Hall, Englewood Cliffs, NJ.

L-J. Brännmark and A. Ahlén, "Robust loudspeaker equalization based on position-independent excess phase modeling," 2007 IEEE ICASSP, Las Vegas, Apr. 2008, To Appear.

M. Sternad and A. Ahlén, "Robust filtering and feedforward control based on probabilistic descriptions of model errors", Automatica, vol. 29, pp. 661-679, 1993.

* cited by examiner

SPATIALLY ROBUST AUDIO PRECOMPENSATION

TECHNICAL FIELD OF THE INVENTION

The present invention generally concerns digital audio precompensation, and more particularly the design of a digital precompensation filter that generates an input signal to a sound generating system, with the aim of modifying the dynamic response of the compensated system, as measured in several measurement positions.

BACKGROUND OF THE INVENTION

A system for generating or reproducing sound, including amplifiers, cables and loudspeakers, will always affect the spectral properties of the sound, often in unwanted ways. The reverberation of the room where the equipment is placed adds further modifications. Sound reproduction with very high quality can be attained by using matched sets of cables, amplifiers and loudspeakers of the highest quality, but this is cumbersome and very expensive. The increasing computational power of PCs and digital signal processors has introduced new possibilities for modifying the characteristics of a sound generating or sound reproducing system. The dynamic properties of the sound generating system may be measured and modeled by recording its response to known test signals, as well known from the literature. A precompensation filter, R in FIG. 1, is then placed between the original sound source and the audio equipment. The filter is calculated and implemented to compensate for the measured properties of the sound generating system, symbolized by H in FIG. 1. In particular, it is desirable that the phase and amplitude response of the compensated system is close to a prespecified ideal response, symbolized by D in FIG. 1. In other words, it is thus required that the compensated sound reproduction $y(t)$ matches the ideal $y_{ref}(t)$ to some given degree of accuracy. The pre-distortion generated by the precompensator R cancels the distortion due to the system H, such that the resulting sound reproduction has the sound characteristic of D. Up to the physical limits of the system, it is thus, at least in theory, possible to attain a superior sound quality, without the high cost of using extreme high-end audio equipment. The aim of the design could, for example, be to cancel acoustic resonances caused by imperfectly built loudspeaker cabinets. Another application could be to minimize low-frequency resonances due to the room acoustics, in different places of the listening room. Yet another aim could be to obtain tonal balance and good staging.

The problem of removing undesired distortions introduced by the electro-acoustical signal path of a sound generating system is commonly called equalization, and also sometimes called dereverberation. An aim could be that the reproduced sound $y(t)$ at a particular listening position should exactly equal the original sound $w(t)$, but we allow it to be delayed by d samples to improve the attainable result. It is then desired that $y(t)=w(t-d)$. Equalization by the use of digital filters has been extensively studied for about two decades, with an increasing concern in recent years for the problem of spatial robustness: A behavior close to the desired should be attained not only at one single measuring point in space, but within an extended spatial volume. Of particular importance for the present work are the time-domain properties of the impulse response of the compensated system: Differences of the dynamic responses at different listening positions may result in an adequate result for some listening positions, while the response deviates at other positions. In particular, significant sound energy may arrive before the intended delay d. Such "pre-ringings" or "pre-echoes" are considered very undesirable if their amplitudes are too large. Parts of the impulse response that are later than the target delay d may also be affected differently at different listening positions. Such "post-ringings" may significantly color the perceived spectrum and tonal balance of the sound.

In the literature, the work on robustness of equalization essentially falls into three categories.

In the first category, the goal of the filter design is a complete signal dereverberation at a single position in a room. A subsequent robustness analysis then investigates the equalizer performance at other spatial positions, or under slightly modified acoustic circumstances. It is well known that this kind of filter design is highly non-robust and causes severe signal degradation when the receiver position changes [1], and even for fixed receiver position, due to the "weak nonstationarity" of the acoustical paths in the room [2].

In the second category, the design objective is not a complete dereverberation, but rather a reduction of linear distortion under the constraint that audio performance should not be degraded by changes of listening position. The standard approach in this category is to design a filter based on averaging and/or smoothing of one or several transfer functions and then perform a robustness analysis of the filter [3]. Such methods, and in particular the complex smoothing operation proposed in [3], provide no possibilities to predict and explicitly control the amount of pre-ringing in the compensated system.

The third category imposes robustness directly on the design by employing a multi-point error criterion to optimize the sound reproduction in a number of spatial positions, either by using measured room transfer functions (RTFs) [4] or by direct adaptation of the inverse [5]. The optimization is in general based on minimum mean square error (MSE) criteria, or the sum of the power spectral densities of the compensation errors at different listening positions. MSE and power spectral density criteria do unfortunately not take the time domain properties of the compensated system into account adequately. Errors due to pre-ringings and post-ringings may result in the same MSE, although their perceptual effect can be very different. There also exists a fundamentally different multi-point scenario, where signals are filtered on the receiver side by a unique equalizer at each receiver point. Spatial robustness in this setting has been studied in [6] and [7]. This approach is however not applicable in the present pre-compensation setting, where a single filter operating on the input of a sound generating system, is designed to equalize the audio response in an extended volume in space.

Equalizers can be designed to compensate for distortions of the received energy at different frequencies. This type of filter will below be called a minimum phase inverse, or resulting in a minimum phase equalizer or magnitude equalizer. A minimum phase inverse compensates for magnitude distortions of the received signal, but does not take the phase properties (the delays of individual frequencies) of the signal into account. In the time domain, a minimum phase inverse will never create pre-ringings at any listening positions, but it may create severe post-ringings. It may even make phase and delay distortions more severe, as compared to the uncompensated system.

Both phase and magnitude distortions can be taken into account by using linear-quadratic Gaussian feedforward filter design or Wiener design, as outlined in e.g. [8]. This method has been used in [9] for designing a general class of audio precompensators. See [10]-[11] for some other FIR-filter-based methods. Design methods and resulting filters that are intended to compensate for both magnitude and phase distortions of the sound generating system will be called mixed phase methods, resulting in mixed phase equalizers. When a mixed phase equalizer is designed to compensate for non-minimum phase zeros of a transfer function, and these zeros differ in the design model and the true system, pre-ringings will unfortunately occur. The currently known mixed-phase designs provide inadequate tools for limiting the resulting pre-ringing effects.

Many researchers have concluded that mixed phase equalizers seem less robust than minimum phase equalizers from a perceptual standpoint. Their inevitable side effects in the form of pre-ringing are perceived to be more objectionable than post-ringings. Since minimum-phase equalizers create no pre-ringings, a common strategy at present for robust and perceptually acceptable equalization is therefore to use minimum phase filters only. This solution is, however, unsatisfying, as it is known to generate large phase distortions in the form of post-ringings and it cannot handle the non-minimum phase part of the audio response at all. The reference [12] proposes as a solution to limit the delay d sufficiently to make the pre-ringing inaudible. This is ineffective, since a small delay limit will for many audio systems severely restrict the ability to perform useful phase correction, in particular at the low frequencies where this is most perceptually important.

SUMMARY OF THE INVENTION

Design techniques and convenient tools for avoiding these drawbacks are thus needed.

The present invention overcomes the difficulties encountered in the prior art.

It is a general objective of the present invention to provide an improved design scheme for audio precompensation filters.

A specific objective of the invention is to obtain a technique that can perform a mixed-phase compensation of non-minimum phase dynamics that can be safely compensated without causing any significant pre-ringings at any listening position, thereby obtaining superior compensation as compared to the known minimum phase compensators.

Another specific objective of the invention is to obtain a technique that uses similarities of different transfer functions, in the form of almost common factors of their transfer functions, or tight clusters of zeros in the complex domain, to obtain mixed phase compensators that attain a given limit on the pre-ringing effects at all or at least a subset of the listening positions.

A basic idea of the present invention is to design a discrete-time audio precompensation filter based on a Single-Input Multiple Output (SIMO) linear model (H) that describes the dynamic response of an associated sound generating system at a number p>1 listening positions, for which the dynamic response differs for at least two of these listening positions. The novel filter design and construction is based on providing information representative of n non-minimum phase zeros $\{z_i\}$ that are outside of the stability region $|z|=1$ in the complex frequency domain, where $1 \leq n < m$, with m being the smallest number of zeros outside $|z|=1$ of any of the p individual scalar models from the single input to the p outputs of the linear model H.

A characteristic of these non-minimum phase zeros is that their inversion by the precompensation filter would result in only acceptably small pre-ringings of the compensated impulse response, smaller than a prespecified limit.

The precompensation filter is then calculated as the product of at least two scalar dynamic systems, represented by:

an inverse of a characteristic scalar magnitude response in the frequency domain that represents the power gains at all or a subset of the p listening positions according to the model H;

a causal Finite Impulse Response (FIR) filter, of user-specified degree d, having coefficients corresponding to a causal part of a delayed non-causal impulse response that is based on the information representative of n non-minimum phase zeros.

Preferably, the causal FIR filter is determined based on the information representative of n non-minimum phase zeros in the form of a design polynomial that has these n non-minimum phase zeros.

The different aspects of the invention include a method, system and computer program for designing an audio precompensation filter, a so designed precompensation filter, an audio system incorporating such a precompensation filter as well as a digital audio signal generated by such a precompensation filter.

The present invention offers the following advantages:
Optimally precompensated audio systems, resulting in superior sound quality and experience.
Provides a time-domain precision that is not attainable with minimum phase filters, while providing means to control the residual pre-ringings normally associated with mixed phase designs so that such effects can be limited to non-perceptible levels at all listening positions.

Other advantages and features offered by the present invention will be appreciated upon reading of the following description of the embodiments of the invention.

BRIEF DESCRIPTION OF THE DRAWINGS

The invention, together with further objects and advantages thereof, will be best understood by reference to the following description taken together with the accompanying drawings, in which.

DETAILED DESCRIPTION OF EMBODIMENTS OF THE INVENTION

Figure 2:
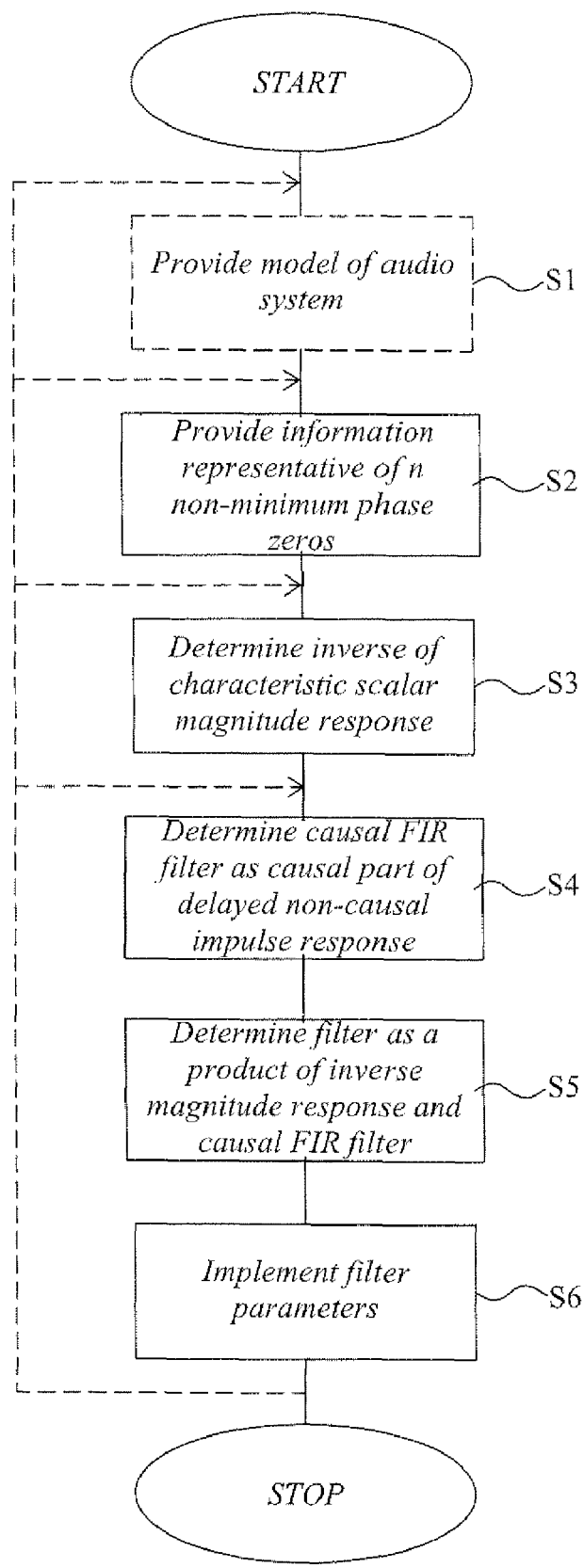
FIG. 2 is a schematic flow diagram illustrating an example of the overall flow of a filter design method according to an exemplary embodiment of the invention.

It may be useful to start with an overview of the overall flow of an exemplary filter design method according to an embodiment of the invention, with reference to the schematic flow diagram of FIG. 2. This flow diagram not only illustrates the actual design steps, but also optional pre-steps (dashed lines) that are preferably used together with the present invention, and hence represents an example of the general steps of designing a precompensation filter of the invention, starting from an uncompensated audio system and ending with an implemented filter.

We will mainly consider a sound generating system with one input signal and p different spatial listening positions, for which the dynamics response is not equal at all positions.

In step S1, a model of the audio system is provided. The model may be determined based on methods well-known for a person skilled in the art, e.g. by determining the model based on physical laws or by conducting measurements on the audio system using known test signals. Preferably the model is a Single Input Multiple Output (SIMO) model that describes the dynamic response of the associated sound generating system (i.e. the audio system) at a number p>1 listening positions, for which the dynamic response differs for at least some of these listening positions. In step S2, there is provided information representative of n non-minimum phase zeros $\{Z_i\}$ that are outside of the stability region $|z|=1$ in the complex frequency domain, where $1 \leq n \leq m$, with m being the smallest number of zeros outside $|z|-1$ of any of the p individual scalar models from the single input to the p outputs of the linear SIMO model. The n non-minimum phase zeros are furthermore selected such that they have the property that their inversion by the precompensation filter results in pre-ringings of the compensated impulse response that are smaller than a prespecified limit. Step S3 involves determining a characteristic scalar magnitude response in the frequency domain that represents the power gains at all the p listening positions according to the SIMO model, and taking the inverse of this characteristic scalar magnitude response. In step S4, a causal Finite Impulse Response (FIR) filter, of user-specified degree A, and having coefficients corresponding to a causal part of a delayed non-causal impulse response is determined based on the information representative of n zeros. In step S5, the precompensation filter is determined as the product of at least the inverse of the characteristic scalar magnitude response and the causal FIR filter. In step S6, the filter parameters of the determined precompensation filter are implemented into filter hardware or software.

If required, the filter parameters may have to be adjusted. The overall design method may then be repeated, or certain steps may be repeated as schematically indicated by the dashed lines.

For example, the information of non-minimum phase zeros may be provided in the form of a design polynomial having n non-minimum phase zeros. The causal FIR filter may then be determined by:
- forming a non-causal all-pass filter based on the design polynomial,
- multiplying the non-causal impulse response of this non-causal all-pass filter by a time delay of d samples, to obtain a delayed non-causal impulse response, and
- selecting a causal part of the delayed non-causal impulse response to obtain said FIR filter.

For a better understanding, the invention will now be described in more detail with reference to various exemplary embodiments. In the following, section 1 introduces the overall problem formulation and the polynomial notation used to describe the assumed discrete-time linear dynamic systems. Section 2 presents exemplary compensator design equations motivated by an ideal case when the systems to the different listening positions have partially common dynamics, Section 3 then generalizes the illustrative method to the case when transfer function zeros are not equal. Section 4 describes some implementation aspects. Further details of the invention, example implementations of algorithm steps and performance examples are provided in the report [13], which is enclosed, and incorporated in its entirety, as Appendix 1 to the application.

1. System Model

It is useful to begin by describing the general approach for designing audio precompensation filters.

The sound generation or reproducing system to be modified is normally represented by a linear time-invariant dynamic model H that describes the relation in discrete time between a set of m input signals u(t) to a set of p output signals y(t):

$$y(t)=H(t)$$

$$y_m(t)=y(t)+e(t), \quad (1.1)$$

where t represents a discrete time index, $y_m(t)$ (with subscript m denoting "measurement") is a p-dimensional column vector representing the sound time-series at p different locations and e(t) represents noise, unmodeled room reflexes, effects of an incorrect model structure, nonlinear distortion and other unmodeled contributions. The operator H is a p×m-matrix whose elements are stable linear dynamic operators or transforms, e.g. represented as FIR filters or IIR filters. These filters will determine the response y(t) to a m-dimensional arbitrary input time series vector u(t). Linear filters or models will be represented by such matrices, which are called transfer function matrices, or dynamic matrices, in the following. The transfer function matrix H represents the effect of the whole or a part of the sound generating or sound reproducing system, including any pre-existing digital compensators, digital-to-analog converters, analog amplifiers, loudspeakers, cables and the room acoustic response. In other words, the transfer function matrix H represents the dynamic response of relevant parts of a sound generating system. When including the dynamics of the listening room, its elements are called room transfer functions, or RTFs. The input signal u(t) to this system, which is a m-dimensional column vector, may represent input signals to m individual amplifier-loudspeaker chains of the sound generating system.

The measured sound $y_m(t)$ is, by definition, regarded as a superposition of the term y(t)=Hu(t) that is to be modified and controlled, and the unmodeled contribution e(t). A prerequisite for a good result in practice is, of course, that the modeling and system design is such that the magnitude |e(t)| will not be large compared to the magnitude |y(t)|, in the frequency regions of interest.

A general objective is to modify the dynamics of the sound generating system represented by (1.1) in relation to some reference dynamics. For this purpose, a reference matrix D is introduced:

$$y_{ref}(t)=Dw(t), \quad (1.2)$$

where w(t) is an r-dimensional vector representing a set of live or recorded sound sources or even artificially generated digital audio signals, including test signals used for designing the filter. The elements of the vector w(t) may, for example, represent channels of digitally recorded sound, or analog sources that have been sampled and digitized. In (1.2), D is a transfer function matrix of dimension m×r that is assumed to be known. The linear system D is a design variable and generally represents the reference dynamics of the vector y(t) in (1.1).

An example of a conceivable design objective may be complete inversion of the dynamics and decoupling of the channels. In cases where r=p, the matrix D is then set equal to a square diagonal matrix with d-step delay operators as diagonal elements, so that:

$$y_{ref}(t)=w(t-d) \qquad (1.3)$$

The reference response of y(t) is then defined as being just a delayed version of the original sound vector w(t), with equal delays of d sampling periods for all elements of w(t). The desired bulk delay, d, introduced through the design matrix D is an important parameter that influences the attainable performance. Causal mixed-phase compensation filters will attain better compensation the higher this delay is allowed to be.

The precompensation is generally obtained by a precompensation filter, generally denoted by R, which generates an input signal vector u(t) to the audio reproduction system (1.1) based on the signal w(t):

$$u(t)=Rw(t). \qquad (1.4)$$

A commonly used design objective is then to generate the input signal vector u(t) to the audio reproduction system (1.1) so that its compensated output y(t) approximates the reference vector $y_{ref}(t)$ well, in some specified sense. This objective can be attained if the signal u(t) in (1.1) is generated by a linear precompensation filter R, which consists of a m×r-matrix whose elements are stable and causal linear dynamic filters that operate on the signal w(t) such that y(t) will approximate $y_{ref}(t)$, $$y(t)=Hu(t)=HRw(t)\cong y_{ref}(t)=Dw(t).$$

Linear discrete-time dynamic systems are in the following represented using the discrete-time backward shift operator, here denoted by $q^{-1}$. A signal s(t) is shifted backward by one sample by this operator: $q^{-1}s(t)=s(t-1)$. Likewise, the forward shift operator is denoted q, so that qs(t)=s(t+1), using the notation of e.g. [15]. A single-input single output (scalar) design model (1.1) is then represented by a linear time-invariant difference equation with fixed scalar coefficients:

$$y(t)=-a_1y(t-1)-a_2y(t-2)-\ldots-a_ny(t-n)+b_0u(t-k)+b_1u(t-k-1)+\ldots+b_hu(t-k-h). \qquad (1.5)$$

Assuming $b_0\neq 0$, there will be a delay of k samples before the input u(t) influences the output y(t). This delay, k, may for example represent an acoustic transport delay and it is here called the bulk delay of the model. The coefficients $a_j$ and $b_j$ determine the dynamic response described by the model. The maximal delays n and h may be many hundreds or even thousands of samples in some models of audio systems.

Move all terms related to y to the left-hand side. With the shift operator representation, the model (1.5) is then equivalent to the expression:

$$(1+a_1q^{-1}+a_2q^{-2}+\ldots+a_nq^{-n})y(t)=(b_0+b_1q^{1}+\ldots+b_bq^{-b})u(t-k).$$

By introducing the polynomials $A(q^{-1})=1+a_1q^{-1}+a_2q^{-2}+\ldots+a_nq^{-n}$ and $B(q^{-1})=b_0+b_1q^{-1}+\ldots+b_hq^{-h}$, the discrete-time dynamic model (1.5) may be represented by the more compact expression:

$$A(q^{-1})y(t)=B(q^{-1})u(t-k). \qquad (1.6)$$

The polynomial $A(q^{-1})$ is said to be monic since its leading coefficient is 1. In the special case of Finite Impulse Response (FIR) models, $A(q^{-1})=1$. In general, the recursion in old outputs y(t−j) represented by the filter $A(q^-)$ gives the model an infinite impulse response. Infinite Impulse Response (IIR) filters represented in the form (1.6) are also denoted rational filters, since their transfer operator may be represented by a ratio of polynomials in $q^{-1}$:

$$y(t)=\frac{B(q^{-1})}{A(q^{-1})}u(t-k).$$

All involved IIR systems, models and filter are in the following assumed to be stable. The stable criterion means that, when a complex variable z is substituted for the operator q, this is equivalent to the equation $A(z^{-1})=0$ having solutions with magnitude |z|<1 only. In other words, the complex function $A(z^{-1})$ must have all zeros within the unit circle in the complex plane. The roots of $A(z^{-})=0$ are the poles of the scalar system. The roots of $B(z^{-1})=0$ are its zeros. The roots of $B(z^{-1})=0$ with magnitude |z|<1 are the minimum phase zeros. Their steady-state influence can be eliminated by a stable compensator system with poles at the corresponding position. The roots of $B(z^{-1})=0$ with magnitude $|z|\geq 1$ are the non-minimum phase zeros. Their influence cannot be eliminated completely by a stable and causal compensator. Their influence can, however, be approximately eliminated by using a stable but non-causal compensator that operates on future time samples. Such compensators can be realized by delaying all involved signals in an appropriate way. In particular, the delay d in (1.3) can be used for this purpose. In the following, we will also assume that all bulk delays are absorbed by the delay d in D, so that k=0 will be used in all transfer functions that are elements of H.

For any polynomial $B(q^{-1})=b_o+b_1q^{-1}+\ldots+b_hq^{-h}$, we further define the conjugate polynomial $B^*(q)=b_0+b_1q+\ldots+b_h q^h$ and the reciprocal polynomial $\bar{B}(q^{-})=b_h+b_{n-1}q^{-1}+\ldots+b_0q^{-h}$ the zeros of B*(z) are reflected in the unit circle with respect to the zeros of $B(z^{-1})$.

2. Design for Common Model Factors

In the following, we will focus on sound reproduction systems with scalar inputs m=1 (i.e. single loudspeaker and amplifier chains), that has multiple listening positions r=p>1. The compensator (1.4) is thus a scalar discrete-time dynamic system. The listening positions are also called control points. The desired response is assumed to be equal to a delay of d samples for all control points, as described by (1.3).

In this example, we use a discrete-time linear single input multiple output (SIMO) model structure $y(t)=H(q^{-1})u(t)$ in common denominator form:

$$y_i(t)=\frac{B_i(q^{-1})}{A(q^{-1})}u(t), \qquad (2.1)$$

$$i=1,\ldots,p.$$

The stable denominator $A(q^{-1})$ is thus the same in the models to all p outputs. This property can always be obtained by writing transfer functions on common denominator form. We will furthermore in this section assume that a set of zeros, of which n>1 are non-minimum phase zeros, are common to all transfer functions. The common zeros define the robust part $B'(q^{-1})$ of the numerator polynomials, while the other zeros comprise the non-robust parts, which are not assumed equal for all outputs:

$$B_i(q^{-1})=B_1^n(q^{-1})B_1^n(q^{-1}), i=1,\ldots,p. \qquad (2.2)$$

The robust numerator factor $B_u^r(q^{-1})$ furthermore is the product of a non-minimum phase ("unstable") factor $B_u^r(q^{-1})$ with n>1 zeros outside the unit circle and a minimum phase ("stable") factor $B_s^r(q^{-1})$: $B^r(q^{-1})=B_s^r(q^{-1})B_s^r(q^{-1})$.

The assumed design model can thus be decomposed into a common scalar IIR model in series with a set of FIR models:

$$z(t) = \frac{B^r(q^{-1})}{A(q^{-1})}u(t) = \frac{B_n^r(q^{-1})B_s^r(q^{-1})}{A(q^{-1})}u(t) \quad (2.3)$$

$$y_i(t) = B_i^n(q^{-1})z(t).$$

The scalar intermediate signal z(t) has been introduced in the above model stricture for pedagogical purposes. It is not assumed to be a physically existing measurable signal.

We furthermore define two scalar design models:

The complex spatial average model, defined as:

$$\frac{B_0(q^{-1})}{A(q^{-1})} = \sum_{i=1}^{p} \frac{B_i(q^{-1})}{A(q^{-1})} = \frac{B^r(q^{-1})}{A(q^{-1})} \sum_{i=1}^{p} B_i^n(q^{-1}). \quad (2.4)$$

The complex gain of $B_0(z^-)/A(z^{-1})$ represents the average of the complex gains of the individual models, pointwise in the frequency domain. Note that the robust numerator polynomial $B^r(q^{-1})$ of the individual models will always be a factor of $B_0(q^{-1})$.

The Root Mean Square (RMS) average model, also known as the minimum phase equivalent model:

$$\frac{\beta(q^{-1})}{A(q^{-1})}, \quad (2.5)$$

where the stable numerator polynomial $\beta(q^{-1})$ is obtained from the regularized spectral factorization equation:

$$\beta_*(q)\beta(q^{-1}) = \quad (2.6)$$

$$\rho + \sum_{i=1}^{p} B_{i*}(q)B_i(q^{-1}) = B_*^r(q)B^r(q^{-1})\sum_{i=1}^{p} B_{i*}^n(q)B_i^n(q^{-1})$$

The RMS average model thus sums the power spectra of the p design models, and then calculates a stable minimum phase system that has the corresponding magnitude spectrum. This model thus includes no phase information of the individual models. The optional regularization term ρ corresponds to the use of an energy penalty on the filter output u(t) in an LQG feedforward compensator filter design, see [8]. It can thus be used for limiting the filter output energy. It also limits the depth of notches in the magnitude response of (2.5).

A regularization parameter with frequency-dependent magnitude may be used. This can be done by generalizing the spectral factorization equation (2.6) to $$\beta_*(q)\beta(q^{-1}) = \rho W_*(q)W(q^{-1}) + \sum_{i=1}^{p} B_{i*}(q)B_i(q^{-1}) = \quad (2.7)$$

$$\rho W_*(q)W(q^{-1}) + B_*^r(q)B^r(q^{-1})\sum_{i=1}^{p} B_{i*}^n(q)B_i^n(q^{-1}).$$

Here, $W(q^{-1})$ is a user-defined FIR weighting filter that provides frequency weighting of the penalty/regularization term. When $pW^*(z)W(z^{-1})>0$ on the unit circle $|z|=1$, then a stable spectral factor $\beta(q^{-1})$ which has no zeros on or outside the unit circle, can always be found. With no penalty/regularization ρ=0, a stable spectral factor exists if the polynomials $B_1(q^{-1})$ do not all have a common factor with zeros on the unit circle.

Finally, based on the unstable part of the robust numerator, of order n, $$B_u^r(q^{-1})=f_0+f_1q^{-1}+\ldots+f_nq^{-n} \quad (2.8)$$

define a design polynomial F(q) by $$F(q)=\bar{B}_u^{r*}(q)=q^n B_u^r(q^1)=f_n+f_{n-1}q+\ldots+f_0q^r \quad (2.9)$$

and its reciprocal polynomial $$\bar{F}(q)=B_u^{r*}(q)=f_0+f_1q+\ldots+f_nq^r. \quad (2.10)$$

The proposed exemplary design of a robust scalar compensator filter for the single-input p output model (1.9) is then given by $$u(t) = Rw(t) = Q(q^{-1})\frac{A(q^{-1})}{\beta(q^{-1})}w(t) \quad (2.11)$$

where the last factor is the inverse of the RMS average model (2.5) while the polynomial (FIR filter) $Q(q^{-1})$ will have degree d equal to the specified design delay. It performs phase compensation, while the inverse of the RMS average performs magnitude compensation only.

In general, a filter $Q(q^{-1})$ that minimizes a prescribed quadratic design criterion can be obtained by solving a linear polynomial equation, a Diophantine equation [8], [15].

We in the following assume that the desired response is w(t−d) at all p measuring positions, i.e. that the matrix D is a column vector containing terms $q^{-d}$. The bulk propagation delays are assumed to be taken care of separately, so that this formulation is sensible also for large listening volumes. A Linear Quadratic Gaussian design for the system (2.3), aiming at minimizing the quadratic criterion $$E\|y(t)\|^2+E\rho\|W(q^{-1})u(t)\|^2 \quad (2.12)$$

where E(.) represents an average over a white input sequence w(t). The compensator is then given by (2.11), where $\beta(q^{-1})$ is obtained from the spectral factorization equation (2.7) and $Q(q^{-1})$, together with a polynomial $L^*(q)$ is obtained as the unique solution to the following scalar Diophantine polynomial equation $$q^{-d}B_0^*(q)=\beta^*(q)Q(q^{-1})+qL^*(q), \quad (2.13)$$

see equation (8) in Appendix 1 [13]. For solutions to more general multi-input LQG feedforward filter design problem formulations, see the equation (3.3.11) in [8].

When d is large and the models for the p listening positions are significantly different, a prefilter designed according to (2.11), (2.7) and (2.13) will in general result in compensated impulse responses with significant pre-ringings at least at some listening positions. A single compensator simply cannot compensate the different dynamics represented by $B_1^n(q^{-1})$ in (2.3) exactly. In this situation, a useful way forward is to base the design of the RMS inverse part in (2.11) and of the polynomial $Q(q^{-1})$ on different system models and criteria. We here propose the following hybrid design:

1. The factor $A(q^{-1})/\beta(q^{-1})$ is kept unchanged in (2.11), with $\beta(q^{-1})$ being obtained from the spectral factorization (2.7). This can be interpreted as a minimum phase equalizer, obtained by minimizing the criterion (2.12) with no allowed delay d=0.

2. The FIR filter $Q(q^{-1})$ is obtained by using a modified criterion and concentrating on compensating the robust part of the model (2.3) only.

If the second step is aimed at minimizing the criterion $$E\|z(t)\|^2 + E\rho\|W_1(q^{-1})u(t)\|^2, \quad (2.14)$$

where z(i) is the (non-measurable) intermediate signal in (2.3) and the frequency weighting factor $W_1(q^{-1})$ may differ from the factor $W(q^{-1})$ used in (2.12) for the first step, then design of $Q(q^{-1})$ involves solving the polynomial spectral factorization $$\beta^{*r}(q)\beta^r(q^{-1}) = \rho W_{1*}(q)W_1(q^{-1}) + B^{*r}(q)B^r(q^{-1}) \quad (2.15)$$

with respect to the stable "robust spectral factor" polynomial $\beta^r(q^{-1})$. The filter polynomial $Q(q^{-1})$ is then obtained by solving the modified Diophantine equation $$q^{-d}\sqrt{p}B^{*r}(q) = \beta^{*r}(q)Q(q^{-1}) + qL^*(q). \quad (2.16)$$

Here, $Q(q^{-1})$ has degree d, and $L^*(q)$ has degree one less than $B^{*r}(q)$. By dividing (2.16) with $\beta^{*r}(q)$, it is evident that the polynomial $Q(q^{-1})$ represents the causal part (the part for negative time shifts) of the impulse response of the filter $$q^{-d}\sqrt{p}\frac{B_*^r(q)}{\beta_*^r(q)} = Q(q^{-1}) + q\frac{L_*(q)}{\beta_*^r(q)} = \quad (2.17)$$

$$m_{-d}q^{-d} + m_{-d+1}q^{-d+1} + \dots + m_0 + m_1q + m_2q^2 + \dots$$

so $$Q(q^{-1}) = m_0 + m_1q + \dots + m_{-d}q^{-d}. \quad (2.18)$$

When using no input penalty in (2.14), the spectral factorization (2.15) simplifies and the relevant expression reduces to an expression of lower degree:

$$q^{-d}\sqrt{p}\frac{B_*^r(q)}{\beta_*^r(q)} = q^{-d}\sqrt{p}\frac{B_{s*}^r(q)B_{n*}^r(q)}{B_{s*}^r(q)\bar{B}_{n*}^r(q)} = q^{-d}\sqrt{p}\frac{F(q)}{\bar{F}(q)}.$$

The first equality follows from the properties of the spectral factorization and it shows that the factor $B_s^{r*}(q)$ can be cancelled when $\rho=0$. Use of the definitions (2.9) and (2.10) then give the second equality. This impulse response can in this case be expressed by $$\sqrt{p}q^{-d}\frac{(f_0 + f_1q + \dots + f_nq^n)}{(f_n + f_{n-1}q + \dots + f_0q^n)} = \quad (2.19)$$

$$m_{-d}q^{-d} + m_{-d+1}q^{-d+1} + \dots + m_0 + m_1q + m_2q^2 + \dots$$

The purpose of the FIR filter (2.18) is to approximately invert the non-minimum phase dynamics that is represented by the unstable part (2.8) of the robust numerator. The fidelity of this approximation is improved by increasing the delay parameter d, which allows a larger part of the total impulse response (2.17) to be used by the compensator filter (2.18). As $d \to \infty$, perfect inversion is approached.

Let us consider three special cases of the proposed compensation filter:
1. When d=0, then $Q(q^{-1})$ just equals the scale factor $\sqrt{p}$. The design reduces to the inverse of the RMS average model.[1] This is the minimum mean square optimal minimum phase equalizer. It equalizes the RMS average model and thus achieves a magnitude response compensation of the average response at the p listening positions. It does not compensate the phase properties of the audio system.

[1] The scale factor $\sqrt{p}$ is needed since the RMS average model as defined here has not been normalized to keep the gain constant as the number of models grows. An alternative formulation where such normalization is used is a trivial modification of the scheme.

2. When p=1, or when all p models are exactly equal, then $B^r(q^{-1})=1$ and by (2.4), $B_0(q^{-1})=pB^r(q^{-1})$. The relevant model then exactly equals the (scalar) robust model. The resulting filter (2.11) is then the MMSE mixed phase filter or LQ optimal feedforward compensator [8] for this model. The solution to this special case is previously known.

3. The case of p>1 listening position where all p models (2.1) are not equal is the situation of primary interest. For this case, the compensator filter defined by (2.7), (2.11), (2.15) and (2.16), represents a novel solution to the robust digital audio precompensation problem. It performs power compensation of the whole set of models since it contains the inverse of the RMS average model as factor. The factor $Q(q^{-1})$ in addition performs robust phase compensation. It represents a causal realizable Wiener design that approximately inverts only the non-minimum phase zeros that are present in the models to all p measurement positions. Pre-ringings of the compensated impulse response coefficients (before coefficient d), due to erroneous compensation will therefore not occur. This design thus combines total power equalization with robust phase compensation for the assumed model structure.

The Appendix 1 [13] provides a further discussion of the properties of these three variants of the filters and the corresponding compensated systems.

While it is useful to design the compensator (2.11) in the form of two separate filters that are connected in series, the actual implementation of the compensator may differ, and be performed in the form most convenient for the application. For example, the inverse of the RMS average factor may be approximated by a FIR filter so that the whole compensator becomes a FIR filter. Another alternative is to implement parts of the compensator as a series connection of second order links (a so-called biquad filter).

The design has here been outlined for a sound generating system with scalar input signal. The design can be obviously generalized to sound generating systems with an arbitrary number m of inputs, by performing the scalar design separately for each input, using an appropriate number of listening positions.

Another useful modification is to use the proposed technique in the modified LQG design technique that is used in conjunction with a specific filter structure in [9]. There, the precompensation filter is regarded as additively decomposed into a fixed filter component in parallel with an adjustable component. The use of this filter structure improves the design utility of frequency weighted input penalty terms in the quadratic criterion.

3. Design for Approximately Common Model Factors

The design of the previous section was based on the assumption that the robust part of the model (2.3) was exactly the same in all the p models. This situation will unfortunately rarely occur in practice. We now generalize the design to the more relevant case where the models contain almost common factors (or near-common factors).

Basing a robust design on average dynamics, or on properties of the p-output system that are relatively stable in the spectral properties at all the measurement positions, has been discussed as a general principle in the prior art [18]. We have found such an approach to be too simplistic: Just because a property of a spectrum looks rather similar when comparing the different models, this does not imply that it will always be safe to use it in a mixed-phase equalizer: Inversion of a dynamic system is a nonlinear operation, with sometimes surprising results. Instead of focusing on the similarity of properties of different models, the present invention bases the design on a different principle: It is based on performing an explicit pre-analysis of the consequences that would occur, if a specific property of the p models, or of an aggregate model, were used for the compensator design. The causal FIR filter forming part of the overall filter design is preferably formed to approximately invert only non-minimum phase zeros that, by the preceding analysis, can be safely inverted.

For design purposes, we here assume a scalar input signal $u(t)$, p output signals $y_i(t)$ and a model (1.7) in common denominator form. Exact common numerator factors are no longer assumed. The zeros of any numerator $B_i(q^{-1})$ may thus differ from all the zeros in all the p−1 other model numerator polynomials $B_j(q^{-1})$, $j \neq i$.[2]

[2] Small deviations of poles can be transformed to approximately equivalent uncertainties/deviations of numerator polynomials, or zeros, of a transfer function, by using the robust design methodology of [17].

The complex spatial average model is, as in section 2, given by:

$$\frac{B_0(q^{-1})}{A(q^{-1})} = \sum_{i=1}^{p} \frac{B_i(q^{-1})}{A(q^{-1})}. \quad (3.1)$$

As candidate properties for use in the robust compensation of non-minimum phase zeros, we will focus on the non-minimum phase zeros of the complex spatial average model (3.1). In section 2, we saw that the robust part of the numerators, if it exists, would always be a factor of the numerator of the complex spatial average model. We will now denote the polynomial formed by these sufficiently common non-minimum phase zeros by F. Note however that the polynomial F will no longer be exactly related to an unstable part of a robust numerator (2.8), as it was designed in (2.9).

In the RMS average model (2.5), the numerator polynomial $\beta(q^{-1})$ is, as before, obtained from the regularized spectral factorization equation:

$$\beta_*(q)\beta(q^{-1}) = \rho W_*(q)W(q^{-1}) + \sum_{i=q}^{p} B_{i*}(q)B_i(q^{-1}). \quad (3.2)$$

Figure 3:
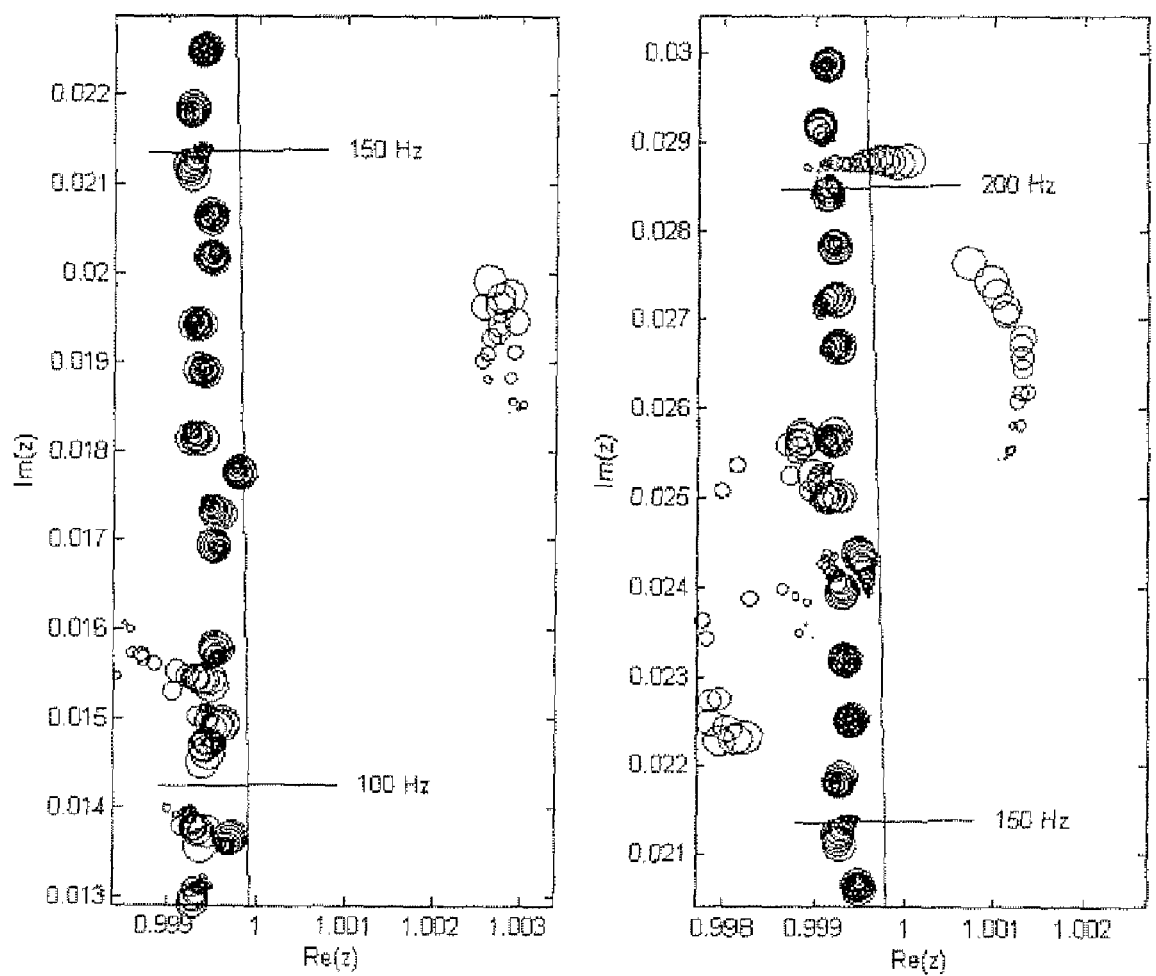
FIG. 3 illustrates clusters of zeros close to the unit circle $|z|=1$ of the complex plane, obtained from the different transfer functions to 18 different listening positions. Zeros are represented by circles, where different radii are used to distinguish individual microphone positions. The two diagrams represent zoomed segments of the complex plane near the unit circle, at frequencies 100-150 Hz (left) and 150-200 Hz (right).

As an example of a situation of interest consider FIG. 3. It illustrates clusters of zeros close to the unit circle $|z|=1$ of the complex plane, obtained from the different transfer functions to 18 different listening positions [16]. Zeros are represented by circles, where different radii are used to distinguish individual microphone positions. The two diagrams represent zoomed segments of the complex plane near the unit circle, at frequencies 100-150 Hz (left) and 150-200 Hz (right). As is evident from FIG. 3, zeros of the room transfer functions move around as the microphone position changes. In particular, slightly above 200 Hz, a zero moves from the inside of the unit circle to the outside—a typical example of a zero that cannot be inverted without causing severe pre- or post-ringing errors in most listening positions. However, some zeros further out from the unit circle exhibit a more static behavior. Based on these observations, it seems reasonable to assume that some non-minimum phase zeros could be safely inverted under a constraint of maximum tolerable residual pre-ringings.

Figure 4:
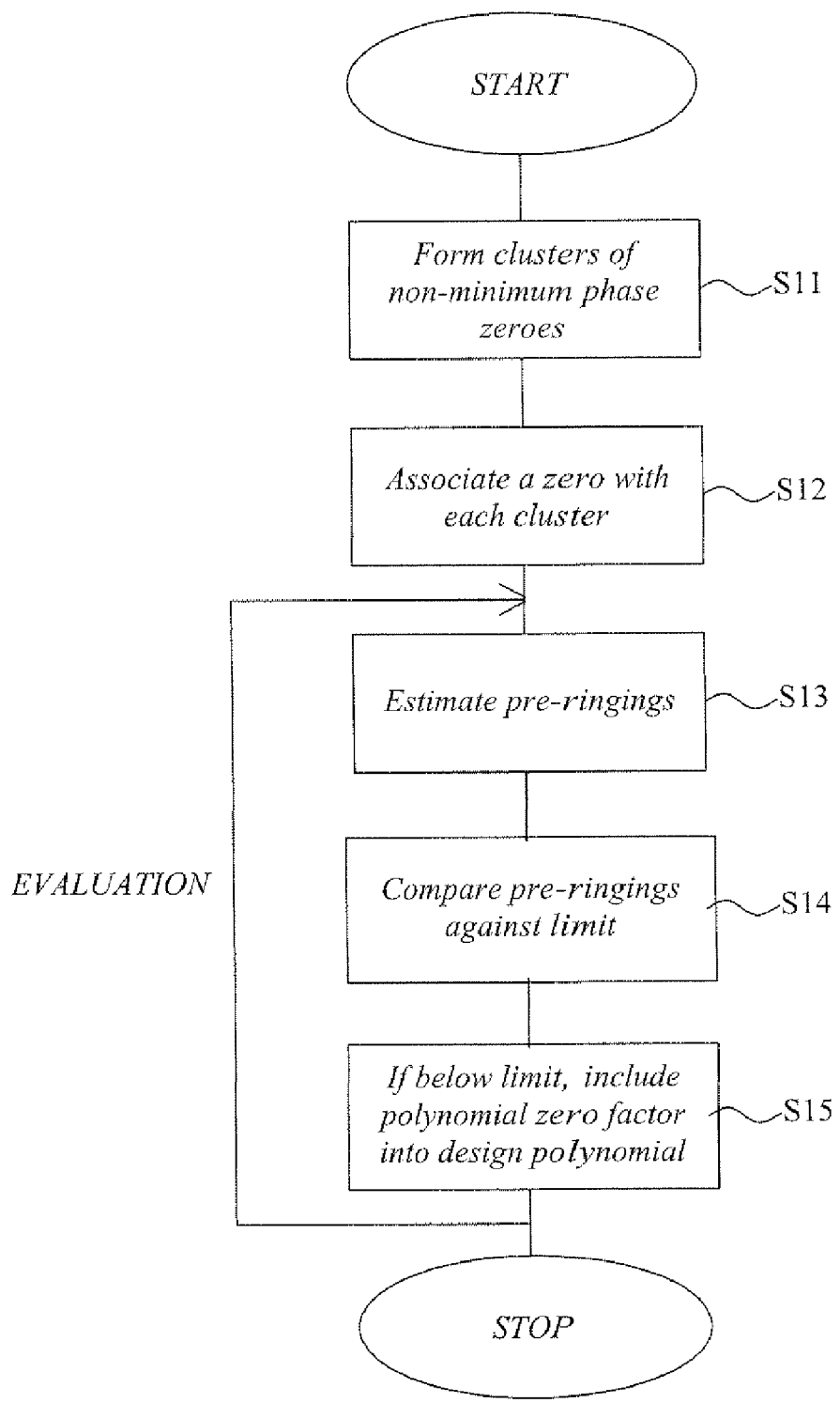
FIG. 4 is a schematic flow diagram illustrating an exemplary procedure for forming a design polynomial used by the present invention.

A proposed exemplary design starts from the zeros of the complex spatial average model (3.1). Reference can be made to the schematic flow diagram of FIG. 4.

1. For the p design models, clusters of non-minimum phase zeros are formed (S11), with at most one zero of a cluster belonging to any model polynomial $B_i(z^{-1})$.
2. A zero of the complex average model (3.1) is associated (S12) with each of these clusters.
3. For each non-minimum phase zero of $B_0(q^{-1})$ in the complex average model, the design algorithm evaluates (EVALUATION in FIG. 4) the pre-ringing that would be obtained if a compensator that uses a given design delay d would include this particular dynamics into the design polynomial F(q), and then approximately invert it according to (2.7)-(2.18). The following procedure is performed for this purpose:
   a. The resulting pre-ringings are estimated (S13). This estimate may be based on the positions and size of the cluster of model zeros that has been associated with this particular non-minimum phase zero of $B_0(q^{-1})$.
   b. The so estimated pre-ringings are compared (S14) against a limit on the impulse response coefficients obtained from a limit on acceptable pre-ringings.
   c. If these impulse response coefficients, as evaluated based on the p design models, all have magnitudes below this limit, a second order polynomial factor defined by the evaluated zero and its complex conjugate is included (S15) into the polynomial $B_u^r(q^{-1}) = f_0 + f_1 q^{-1} + \ldots + f_n q^{-1}$ introduced in (2.8).
   d. If the modeled pre-ringing is too large, the zero is not included in (2.8).
4. After having evaluated all non-minimum phase zeros of $B_0(q^{-1})$ in the complex average model (3.1), and thus having formed the complete design polynomial F(q), a robust precompensator (i.e. the audio filter) may be designed as specified by (2.7), (2.11), (2.15) and (2.16).

A non-causal exponential decay function, i.e. a function that decays exponentially forward in time, is a specific example of a time domain criterion for the impulse response coefficients that can be used as a limit for the pre-ringings:

$$20 \log_{10}(Cr_0^{-\kappa}) < L_{min}. \quad (3.3)$$

Here, C and $r_0$ are scaling constants, $\kappa > 0$ is a time constant and $L_{min}$ is the maximum tolerable pre-ringing level, measured in dB, in the equalized response h(k) at time index $k = d - \kappa$. This constraint ensures that the pre-ringing level generated by compensating the evaluated zero is at most $L_{min}$ dB at all time instants prior to $k = d - \kappa$. It should be noted that many zeros are likely to contribute to the total pre-ringing. The individual constraint (3.3) should be adjusted with this in mind.

Figure 5:
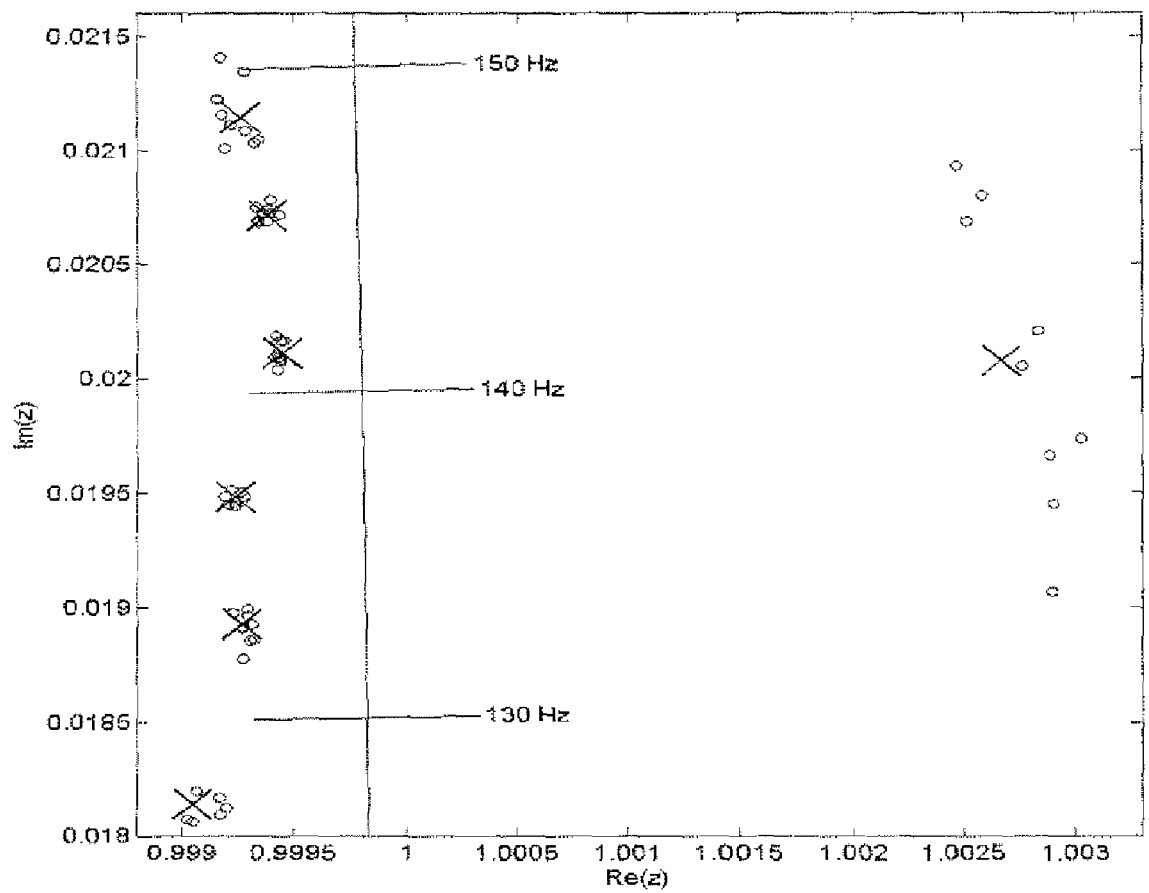
FIG. 5 shows a zoomed segment of the complex plane near the unit circle, showing the zeros of 9 room transfer functions (RTF)s marked as 'o' and their complex spatial average, marked as 'x'.

It has above been assumed that a cluster of zeros can be associated with the zero of $B_0(q^{-1})$ under evaluation. The limit (3.3) is then evaluated with respect to the positions of zeros belonging to this cluster, and their relations to the zero under evaluation. FIG. 5 illustrates such a situation. The right-hand cross is the non-minimum phase zero (outside the unit circle) of the complex average model under evaluation. The rings around it are the cluster of zeros of nine individual room transfer functions. Sect. V.C of Appendix 1 [13], presents equations (38)-(40) that approximately quantify the amount of pre-ringings that would result: For a conjugate pair of nominal zeros $z_0$ and $conj(z_0)$ parameterized as $$z_0 = r_0 \exp(j\omega_0), \; conj(z_0) = r_0 \exp(-j\omega_0), \text{ where } r_0 |z_0|,$$

they, together with the pre-ringing envelope constraint (3.3) and its parameters C, $L_{min}$ and $\kappa$, implicitly define a region around $z_0$ within which a zero cluster must be contained in order for $z_0$ to be considered a common, robustly invertible, zero of all the involved room transfer functions. It can from FIG. 3 in Appendix 1 be observed that zero clusters can be allowed to be larger if the nominal zero $z_0$ is located further away from the unit circle, than when $z_0$ is close to the unit circle.

The above exemplary algorithm preferably works in conjunction with a scheme for clustering of near-common excess phase zeros that belong to different room transfer function models. One particular such scheme is outlined in section V.F of Appendix 1.

We thus obtain a method for trading phase compensation fidelity against bounds on the amount of pre-ringing at any listening position. For a given set of p models and given design delay d, the technique of this invention provides a tool for optimizing frequency domain design criteria while satisfying a time-domain pre-ringing constraint.

Finally, let us point out that the RMS spatial average model defined by (2.5) and (3.2) may optionally be processed by smoothing in the frequency domain before its inverse is used in the compensator filter (2.11). The reason for this is that the number p of transfer function measurements is limited. The number is in most practical filter designs much smaller than that needed to interpolate the whole listening space at the frequencies of interest. Therefore, the RMS spatial average model will not represent the true RMS average over all possible listening positions. In particular, the sample RMS average tends to have a more irregular frequency response than the true RMS average. A method can therefore be used to better estimate the true RMS average based on a limited number of measured room transfer functions. One possible and commonly used approach, which produces a less irregular frequency response, is to use a smoothing in the frequency domain of the finite sample RMS average (2.4). It may be advantageous to use a frequency-dependent degree of smoothing, as provided by the well-known octave smoothing filter, and as is also discussed in [14].[3]

[3] The reference [14] proposes the principle of using smoothing that is variable with frequency across the signal spectrum as a patented claim. This is however a design technique that is previously well-known in the form of e.g. octave smoothing.

4. Implementational Aspects

Typically, the design equations are solved on a separate computer system to produce the filter parameters of the precompensation filter. The calculated filter parameters are then normally downloaded to a digital filter, for example realized by a digital signal processing system or similar computer system, which executes the actual filtering.

Although the invention can be implemented in software, hardware, firmware or any combination thereof, the filter design scheme proposed by the invention is preferably implemented as software in the form of program modules, functions or equivalent. The software may be written in any type of computer language, such as C, C++ or even specialized languages for digital signal processors (DSPs). In practice, the relevant steps, functions and actions of the invention are mapped into a computer program, which when being executed by the computer system effectuates the calculations associated with the design of the precompensation filter. In the case of a PC-based system, the computer program used for the design of the audio precompensation filter is normally encoded on a computer-readable medium such as a DVD, CD or similar structure for distribution to the user/filter designer, who then may load the program into his/her computer system for subsequent execution. The software may even be downloaded from a remote server via the Internet.

Figure 6:
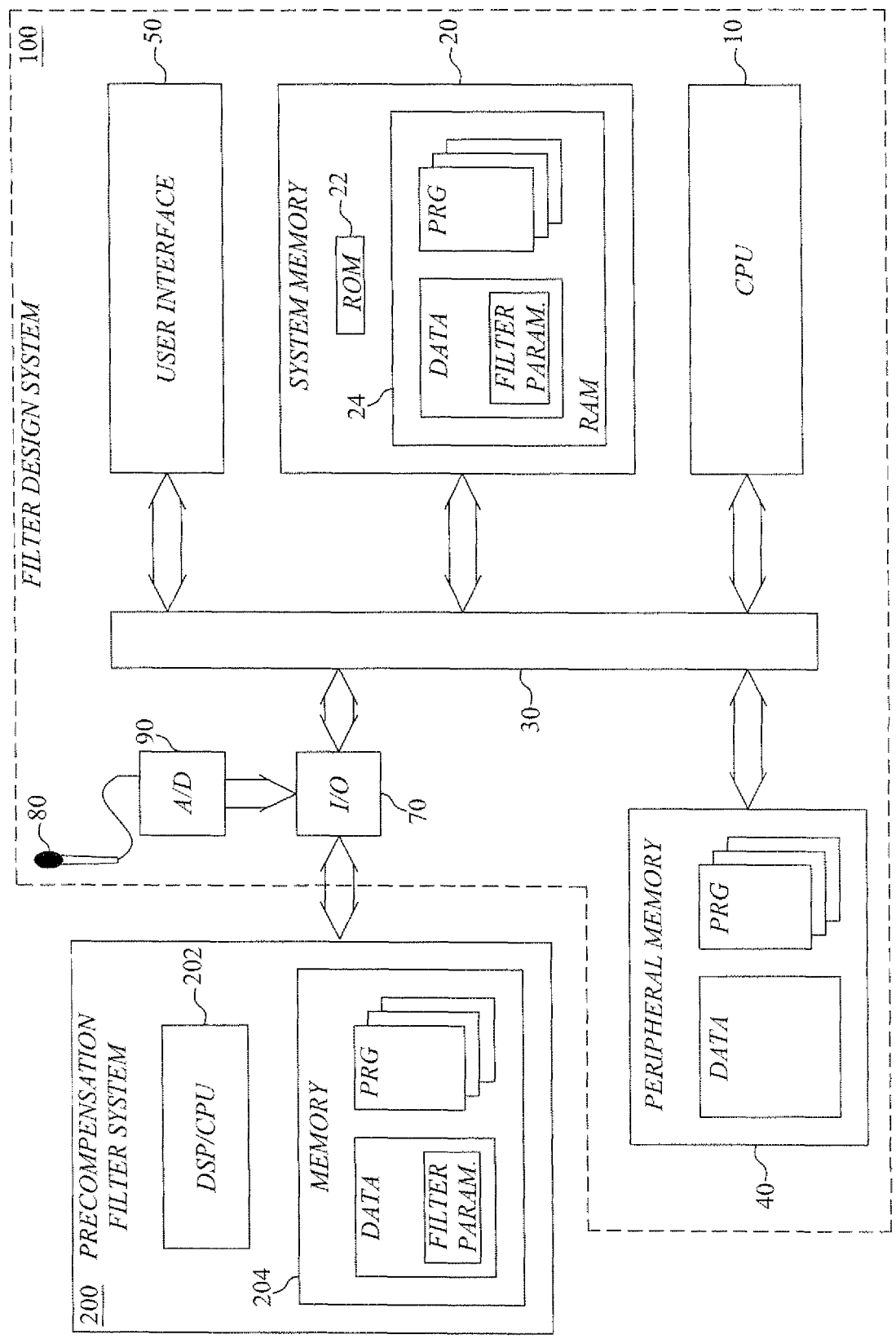
FIG. 6 is a schematic block diagram of an example of computer-based system suitable for implementation of the invention.

FIG. 6 is a schematic block diagram illustrating an example of a computer system suitable for implementation of a filter design algorithm according to the invention. The system 100 may be realized in the form of any conventional computer system, including personal computers (PCs), mainframe computers, multiprocessor systems, network PCs, digital signal processors (DSPs), and the like. Anyway, the system 100 basically comprises a central processing unit (CPU) or digital signal processor (DSP) core 10, a system memory 20 and a system bus 30 that interconnects the various system components. The system memory 20 typically includes a read only memory (ROM) 22 and a random access memory (RAM) 24. Furthermore, the system 100 normally comprises one or more driver-controlled peripheral memory devices 40, such as hard disks, magnetic disks, optical disks, floppy disks, digital video disks or memory cards, providing non-volatile storage of data and program information. Each peripheral memory device 40 is normally associated with a memory drive for controlling the memory device as well as a drive interface (not illustrated) for connecting the memory device 40 to the system bus 30. A filter design program implementing a design algorithm according to the invention, possibly together with other relevant program modules, may be stored in the peripheral memory 40 and loaded into the RAM 22 of the system memory 20 for execution by the CPU 10. Given the relevant input data, such as a model representation and other optional configurations, the filter design program calculates the filter parameters of the precompensation filter.

The determined filter parameters are then normally transferred from the RAM 24 in the system memory 20 via an I/O interface 70 of the system 100 to a precompensation filter system 200. Preferably, the precompensation filter system 200 is based on a digital signal processor (DSP) or similar central processing unit (CPU) 202, and one or more memory modules 204 for holding the filter parameters and the required delayed signal samples. The memory 204 normally also includes a filtering program, which when executed by the processor 202, performs the actual filtering based on the filter parameters.

Instead of transferring the calculated filter parameters directly to a precompensation filter system 200 via the T/O system 70, the filter parameters may be stored on a peripheral memory card or memory disk 40 for later distribution to a precompensation filter system, which may or may not be remotely located from the filter design system 100. The calculated filter parameters may also be downloaded from a remote location, e.g. via the Internet, and then preferably in encrypted form.

In order to enable measurements of sound produced by the audio equipment under consideration, any conventional microphone unit(s) or similar recording equipment 80 may be connected to the computer system 100, typically via an analog-to-digital (A/D) converter 80. Based on measurements of (conventional) audio test signals made by the microphone 80 unit, the system 100 can develop a model of the audio system, using an application program loaded into the system memory 20. The measurements may also be used to evaluate the performance of the combined system of precompensation filter and audio equipment. If the designer is not satisfied with the resulting design, he may initiate a new optimization of the precompensation filter based on a modified set of design parameters.

Furthermore, the system 100 typically has a user interface 50 for allowing user-interaction with the filter designer. Several different user-interaction scenarios are possible.

For example, the filter designer may decide that he/she wants to use a specific, customized set of design parameters in the calculation of the filter parameters of the filter system 200. The filter designer then defines the relevant design parameters via the user interface 50.

It is also possible for the filter designer to select between a set of different pre-configured parameters, which may have been designed for different audio systems, listening environments and/or for the purpose of introducing special characteristics into the resulting sound. In such a case, the preconfigured options are normally stored in the peripheral memory 40 and loaded into the system memory during execution of the filter design program.

The filter designer may also define the reference system by using the user interface 50. In particular, the delay d of the reference system may be selected by the user, or provided as a default delay.

Instead of determining a system model based on microphone measurements, it is also possible for the filter designer to select a model of the audio system from a set of different preconfigured system models. Preferably, such a selection is based on the particular audio equipment with which the resulting precompensation filter is to be used.

Preferably, the audio filter is embodied together with the sound generating system so as to enable generation of sound influenced by the filter.

In an alternative implementation, the filter design is preformed more or less autonomously with no or only marginal user participation. An example of such a construction will now be described. The exemplary system comprises a supervisory program, system identification software and filter design software. Preferably, the supervisory program first generates test signals and measures the resulting acoustic response of the audio system. Based on the test signals and the obtained measurements, the system identification software determines a model of the audio system. The supervisory program then gathers and/or generates the required design parameters and forwards these design parameters to the filter design program, which calculates the precompensation filter parameters. The supervisory program may then, as an option, evaluate the performance of the resulting design on the measured signal and, if necessary, order the filter design program to determine a new set of filter parameters based on a modified set of design parameters. This procedure may be repeated until a satisfactory result is obtained. Then, the final set of filter parameters are downloaded/implemented into the precompensation filter system.

It is also possible to adjust the filter parameters of the precompensation filter adaptively, instead of using a fixed set of filter parameters. During the use of the filter in an audio system, the audio conditions may change. For example, the position of the loudspeakers and/or objects such as furniture in the listening environment may change, which in turn may affect the room acoustics, and/or some equipment in the audio system may be exchanged by some other equipment leading to different characteristics of the overall audio system. In such a case, continuous or intermittent measurements of the sound from the audio system in one or several positions in the listening environment may be performed by one or more microphone units or similar sound recording equipment. The recorded sound data may then be fed into a filter design system, such as system 100 of FIG. 6, which calculates a new audio system model and adjusts the filter parameters so that they are better adapted for the new audio conditions.

Naturally, the invention is not limited to the arrangement of FIG. 6. As an alternative, the design of the precompensation filter and the actual implementation of the filter may both be performed in one and the same computer system 100 or 200. This generally means that the filter design program and the filtering program are implemented and executed on the same DSP or microprocessor system.

Figure 7:
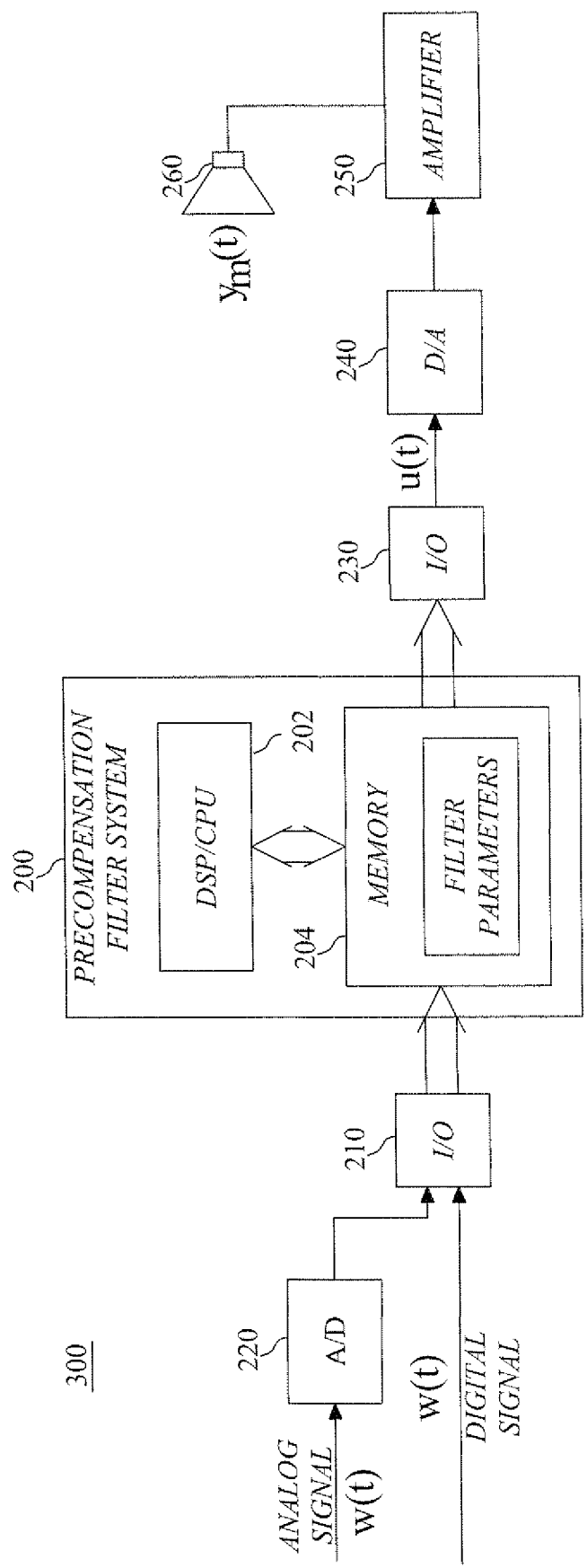
FIG. 7 illustrates an exemplary audio system incorporating a precompensation filter configured according to the design method of the invention.

A sound generating or reproducing system 300 incorporating a precompensation filter system 200 according to the present invention is schematically illustrated in FIG. 7. An audio signal w(t) from a sound source is forwarded to a precompensation filter system 200, possibly via a conventional I/O interface 210. If the audio signal w(t) is analog, such as for LPs, analog audio cassette tapes and other analog sound sources, the signal is first digitized in an A/D converter 210 before entering the filter 200. Digital audio signals from e.g. CDs, DAT tapes, DVDs, mini discs, and so forth may be forwarded directly to the filter 200 without any conversion.

The digital or digitized input signal w(t) is then precompensated by the precompensation filter 200, basically to take the effects of the subsequent audio system equipment into account.

The resulting compensated signal u(t) is then forwarded, possibly through a further I/O unit 230, for example via a wireless link, to a D/A-converter 240, in which the digital compensated signal u(t) is converted to a corresponding analog signal. This analog signal then enters an amplifier 250 and a loudspeaker 260. The sound signal $y_m(t)$ emanating from the loudspeaker 260 then has the desired audio characteristics, giving a close to ideal sound experience. This means that any unwanted effects of the audio system equipment have been eliminated through the inverting action of the precompensation filter.

The precompensation filter system may be realized as a stand-alone equipment in a digital signal processor or computer that has an analog or digital interface to the subsequent amplifiers, as mentioned above. Alternatively, it may be integrated into the construction of a digital preamplifier, a computer sound card, a compact stereo system, a home cinema system, a computer game console, a TV, an MP3 player docking station or any other device or system aimed at producing sound. It is also possible to realize the precompensation filter in a more hardware-oriented manner, with customized computational hardware structures, such as FPGAs or ASICs.

Figure 1:
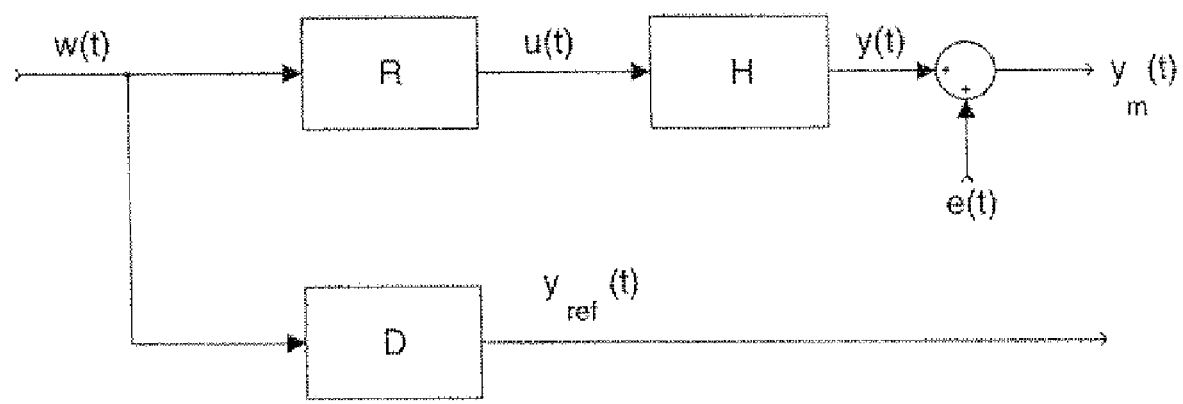
FIG. 1 is a general description of a compensated sound generating system.

It should be understood that the precompensation may be performed separate from the distribution of the sound signal to the actual place of reproduction. The precompensation signal generated by the precompensation filter does not necessarily have to be distributed immediately to and in direct connection with the sound generating system, but may be recorded on a separate medium for later distribution to the sound generating system. The compensation signal u(t) in FIG. 1 could then represent for example recorded music on a CD or DVD disk that has been adjusted to a particular audio equipment and listening environment. It can also be a precompensated audio file stored on an Internet server for allowing subsequent downloading of the file to a remote location over the Internet.

The embodiments described above are merely given as examples, and it should be understood that the present invention is not limited thereto. Further modifications, changes and improvements that retain the basic underlying principles disclosed and claimed herein are within the scope of the invention.

REFERENCES

[1] B. D. Radlovic, R. C. Williamson and R. A. Kennedy, "Equalization in an acoustic reveberant environment: Robustness results," *IEEE Transactions on Speech and Audio Processing*, vol. 8, no. 3, pp. 311-319, May 2000.
[2] P. Hatzinatoniou and J. Mourjopoluos, "Errors in real-time room acoustics deveberation," *J, Audio Engineering Society*, vol. 52, no. 9, pp. 883-899, September 2004.
[3] P. Hatzinatoniou and J. Mourjopoluos, "Real-time room equalization based on complex smoothing: Robustness results," *Proc. of the 116th AES Convention*, 2004.
[4] R. Wilson, "Equalization of loudspeaker drive units considering both on- and off-axis responses," *J. Audio Engineering Society*, vol. 39, no. 3, pp. 127-139, 1991.
[5] S. J. Elliott and P. A. Nelson, "Multiple-point equalization in a room using adaptive digital filters," *J. Audio Engineering Society*, vol. 37, no. 11, pp. 899-907, 1989.
[6] F. Talantzis and D. B. Ward, "Robustness of multichannel equalization in an acoustic reverberation environment," *Journal of the Acoustic Society of America*, vol. 114, no. 2, pp. 833-841, 2003.
[7] F. Talantzis and L. Polymenakos, "Robustness of non-exact multichannel equalization in reveberant environments," in *Artificial Intelligence and Innovations 2007. From Theory to Applications*, C. Boukis, A. Pnevmatikakis and L. Polymerankos, eds, vol. 247 of IFIP International Federation for Information Processing, pp. 315-321, Springer, Boston, 2007.
[8] M. Sternad and A. Ahlén, "LQ controller design and self-tuning control," in *Polynomial Methods in Optimal Control and Filtering*, K. Hunt ed., pp. 56-92, Peter Peregrinus, London, 1993.
[9] U.S. Pat. No. 7,215,787.
[10] U.S. Pat. No. 4,683,590.
[11] U.S. Pat. No. 5,727,066.
[12] U.S. Pat. No. 5,627,899.
[13] L-J Brännmark and A. Ahlén, "Spatially Robust Audio Compensation Based on SIMO Feedforward Control", Unpublished manuscript, enclosed as Appendix 1.
[14] U.S. Pat. No. 6,760,451.
[15] Åström K. J. and B. Wittenmark (1997) *Computer-Controlled Systems*, 3rd ed. Prentice-Hall, Englewood Cliffs, N.J.
[16] L-J. Brännmark and A. Ahlén, "Robust loudspeaker equalization based on position-independent excess phase modeling," 2007 *IEEE ICASSP*, Las Vegas, April 2008, To Appear.
[17] M. Sternad and A. Ahlén, "Robust filtering and feedforward control based on probabilistic descriptions of model errors", *Automatica*, vol. 29, pp. 661-679, 1993.
[18] U.S. Pat. No. 5,511,129.

The invention claimed is:

1. A method for designing a discrete-time audio precompensation filter based on a Single-Input Multiple Output linear model (H) that describes the dynamic response of an associated sound generating system at p>1 listening positions, for which said dynamic response differs for at least two of these listening positions, said method comprising the steps of:

providing information representative of n non-minimum phase zeros $\{z_i\}$ that are outside of the stability region $|z|=1$ in the complex frequency domain, where $1 \leq n < m$, with m being the smallest number of zeros outside $|z|=1$ of any of the p individual scalar models from the single input to the p outputs of the linear model H, said non-minimum phase zeros having the property that their inversion by the precompensation filter results in pre-ringings of the compensated impulse response that are smaller than a prespecified limit;

determining said precompensation filter as the product of at least two scalar dynamic systems, represented by:

i) an inverse of a characteristic scalar magnitude response in the frequency domain that represents the power gains at all or a subset of the p listening positions according to the model H;

ii) a causal Finite Impulse Response (FIR) filter of user-specified degree d, wherein said FIR filter has coefficients corresponding to a causal part of a delayed non-causal impulse response that is based on said information representative of n non-minimum phase zeros.

2. The method according to claim 1, wherein said step of providing information representative of n non-minimum phase zeros comprises the step of forming a design polynomial F(z) having said n zeros, and said causal FIR filter, of user-specified degree d, is represented by a polynomial denoted $Q(q^{-1})$ where $q^{-1}$ is the backward shift operator $q^{-1}v(t)=v(t-1)$, and wherein said FIR filter is obtained by forming a non-causal all-pass filter having the polynomial F(q) as denominator, where the forward shift operator q defined as $qv(t)=v(t+1)$, is substituted for the complex variable z, multiplying the non-causal impulse response of this non-causal all-pass filter by a time delay of d samples, to obtain a delayed non-causal impulse response, setting $Q(q^{-1})$ equal to a causal part of said delayed non-causal impulse response.

3. The method according to claim 2, wherein said FIR filter $Q(q^{-1})$ approximately inverts the non-minimum phase dynamics of a causal linear discrete-time dynamic system that has F(q) as its transfer function numerator.

4. The method according to claim 2, wherein a stable scalar design model is formed as the complex spatial average of the p individual scalar dynamic models in H that describe the separate responses at the p listening positions, and the zeros of the design polynomial F(z) are selected as a subset of the non-minimum phase zeros (zeros outside $|z|=1$) of said scalar design model.

5. The method according to claim 4, wherein the set of zeros $\{z_i\}$ of the scalar design model that are selected to be zeros of the design polynomial F(z) are selected by judging the magnitudes of the coefficients prior to a delay equal to d of the impulse response vector of the compensated response $H(q^{-1})R(q^{-1})$ for the p measurement positions, where $R(q^{-1})$ denotes said precompensation filter.

6. The method according to claim 5, wherein each zero of the transfer function of the scalar design model is associated with a cluster of zeros, where each zero of a cluster is equal or approximately equal to a zero of an individual transfer function of the model H and where said clusters are used to estimate the magnitudes of the coefficients prior to a delay d of the impulse response vector of the compensated response to the p measurement positions.

7. The method according to claim 2, where the polynomial $Q(q^{-1})$ is a scaled by a scalar, c, resulting in the design equation:

$$cq^{-d}\frac{(f_0 + f_1q + \ldots + f_nq^n)}{(f_n + f_{n-1}q + \ldots + f_0q^n)} = m_{-d}q^{-d} + m_{-d+1}q^{-d+1} + \ldots + m_0 + m_1q + m_2q^2 + \ldots$$

where $f_i$ are the coefficients of the design polynomial $F(q)=f_n-f_{n-1}q+\ldots+f_0q^n$ and $m_i$ are the coefficients of the delayed non-causal impulse response, and setting $Q(q^{-1})$ equal to the causal part of this delayed non-causal impulse response gives:

$$Q(q^{-1})=m_0+m_1q+\ldots+m_{-d}q^{-d}.$$

8. The method according to claim 1, wherein the information representative of n non-minimum phase zeros represents an approximate common factor of the p transfer function numerator polynomials in the model H that is represented by a vector of p rational discrete-time transfer functions.

9. The method according to claim 1, wherein the characteristic scalar magnitude response is obtained by
forming a Root Mean Square (RMS) average model by summing the power spectral densities of the p rational discrete-time transfer functions and adding an optional frequency-dependent scalar regularization parameter, and
optionally performing frequency-domain smoothing of the frequency response curve of said RMS average model.

10. The method according to claim 1, wherein the linear model (H) that describes the dynamic response of an associated sound generating system is determined based on measurements of sound at said p>1 listening positions, said sound being produced by said sound generating system, and said step of calculating said precompensation filter as the product of at least two scalar dynamic systems comprises the step of determining corresponding filter parameters, and said audio precompensation filter is created by implementing the determined filter parameters in a filter structure.

11. The method according to claim 10, wherein said filter structure is embodied together with said associated sound generating system so as to enable generation of sound influenced by said audio precompensation filter.

12. An audio precompensation filter designed by using the method according to claim 1.

13. An audio system comprising a sound generating system and an audio precompensation filter in the input path to said sound generating system, wherein said audio precompensation filter is designed by using the method according to claim 1.

14. A digital audio signal generated by a precompensation filter designed by using the method according to claim 1.

15. A computer program product for designing, when running on a computer system, a discrete-time audio precompensation filter based on a Single-Input Multiple Output linear model (H) that describes the dynamic response of an associated sound generating system at p>1 listening positions, for which the said dynamic response differs for some of these listening positions, said computer program product comprising:
program means for providing information representative of n non-minimum phase zeros $\{z_i\}$ that are outside of the stability region $|z|=1$ in the complex frequency domain, where $1 \leq n < m$, with m being the smallest number of zeros outside $|z|=1$ of any of the p individual scalar models from the single input to the p outputs of the linear model H;
program means for determining a characteristic scalar magnitude response in the frequency domain that represents the power gains at all or a subset of the p listening positions according to the model H;
program means for determining, based on said information representative of n non-minimum phase zeros, a causal Finite Impulse Response (FIR) filter having coefficients corresponding to a causal part of a delayed non-causal impulse response, said causal FIR filter being of user-specified degree d; and
program means for determining, for design purposes, said precompensation filter as the product of at least two scalar dynamic systems, represented by:
i) an inverse of said characteristic scalar magnitude response;
ii) said causal Finite Impulse Response (FIR) filter.

16. A system for designing a discrete-time audio precompensation filter based on a Single-Input Multiple Output linear model (H) that describes the dynamic response of an associated sound generating system at p>1 listening positions, for which the said dynamic response differs for at least two of these listening positions, said system comprising:
means for providing information representative of n non-minimum phase zeros $\{z_i\}$ that are outside of the stability region $|z|=1$ in the complex frequency domain, where $1 \leq n < m$, with m being the smallest number of zeros outside $|z|=1$ of any of the p individual scalar models from the single input to the p outputs of the linear model H, said non-minimum phase zeros having the property that their inversion by the precompensation filter results in pre-ringings of the compensated impulse response that are smaller than a prespecified limit;
means for determining a characteristic scalar magnitude response in the frequency domain that represents the power gains at all or a subset of the p listening positions according to the model H;
means for determining, based on said information representative of n non-minimum phase zeros, a causal Finite Impulse Response (FIR) filter having coefficients corresponding to a causal part of a delayed non-causal impulse response, said causal FIR filter being of user-specified degree d;
means for determining, for design purposes, said precompensation filter as the product of at least two scalar dynamic systems, represented by:
i) an inverse of said characteristic scalar magnitude response;
ii) said causal Finite Impulse Response (FIR) filter.

17. The system according to claim 16, wherein said means for providing information representative of n non-minimum phase zeros comprises means for forming a design polynomial F(z) having said n zeros, and said causal FIR filter, of user-specified degree d, is represented by a polynomial denoted $Q(q^{-1})$ where $q^{-1}$ is the backward shift operator $q^{-1}v(t)=v(t-1)$, and wherein said means for determining a FIR filter comprises:
means for providing a non-causal all-pass filter having the polynomial F(q) as denominator, where the forward shift operator q defined as $qv(t)=v(t+1)$, is substituted for the complex variable z,
means for multiplying the non-causal impulse response of this non-causal all-pass filter by a time delay of d samples, to obtain a delayed non-causal impulse response, means for setting $Q(q^{-1})$ equal to a causal part of said delayed non-causal impulse response.

18. The system according to claim 17, wherein said FIR filter $Q(q^{-1})$ is configured to approximately invert the non-minimum phase dynamics of a causal linear discrete-time dynamic system that has F(q) as its transfer function numerator.

19. The system according to claim 17, comprising means for providing a stable scalar design model as the complex spatial average of the p individual scalar dynamic models in H that describe the separate responses at the p listening positions, and wherein the zeros of the design polynomial F(z) are selected as a subset of the non-minimum phase zeros (zeros outside |z|=1) of said scalar design model.

20. The system according to claim 19, wherein said means for providing a design polynomial is configured for selecting the set of zeros $\{z_i\}$ of the scalar design model that are selected to be zeros of the design polynomial F(z) by judging the magnitudes of the coefficients prior to a delay equal to d of the impulse response vector of the compensated response $H(q^{-1})R(q^{-1})$ for the p measurement positions, where $R(q^{-1})$ denotes said precompensation filter.

21. The system according to claim 20, wherein each zero of the transfer function of the scalar design model is associated with a cluster of zeros, where each zero of a cluster is equal or approximately equal to a zero of an individual transfer function of the model H and where said clusters are used to estimate the magnitudes of the coefficients prior to a delay d of the impulse response vector of the compensated response to the p measurement positions.

22. The system according to claim 17, wherein means for determining a causal FIR filter comprises means for scaling the polynomial $Q(q^{-1})$ by a scalar, c, resulting in the design equation:

$$cq^{-d}\frac{(f_0 + f_1 q + \ldots + f_n q^n)}{(f_n + f_{n-1} q + \ldots + f_0 q^n)} = m_{-d}q^{-d} + m_{-d+1}q^{-d+1} + \ldots + m_0 + m_1 q + m_2 q^2 + \ldots$$

where $f_i$ are the coefficients of the design polynomial $F(q)=f_n-f_{n-1}q+\ldots+f_0 q^n$ and $m_i$ are the coefficients of the delayed non-causal impulse response, and said means for setting $Q(q^{-1})$ equal to the causal part of this delayed non-causal impulse response gives:

$$Q(q^{-1})=m_0+m_1 q+\ldots+m_{-d}q^{-d}.$$

23. The system according to claim 16, wherein said means for providing information representative of n non-minimum phase zeros is configured to provide information that represents an approximate common factor of the p transfer function numerator polynomials in the model H that is represented by a vector of p rational discrete-time transfer functions.

24. The system according to claim 16, wherein said means for determining a characteristic scalar magnitude response comprises
   means for forming a Root Mean Square (RMS) average model by summing the power spectral densities of the p rational discrete-time transfer functions and adding an optional frequency-dependent scalar regularization parameter, and
   means for optionally performing frequency-domain smoothing of the frequency response curve of said RMS average model.

25. The system according to claim 16, further comprising means for determining the linear model (H) that describes the dynamic response of the associated sound generating system based on measurements of sound at said p>1 listening positions, said sound being produced by said sound generating system, and said means for calculating said precompensation filter as the product of at least two scalar dynamic systems comprises means for determining corresponding filter parameters, wherein said audio precompensation filter is created by implementing the determined filter parameters in a filter structure.

26. The system according to claim 25, wherein said filter structure is embodied together with said associated sound generating system so as to enable generation of sound influenced by said audio precompensation filter.

* * * * *